(12) United States Patent
Schubert

(10) Patent No.: US 8,410,515 B2
(45) Date of Patent: Apr. 2, 2013

(54) SOLID STATE LIGHTING DEVICES WITH POINT CONTACTS AND ASSOCIATED METHODS OF MANUFACTURING

(75) Inventor: Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 12/872,864

(22) Filed: Aug. 31, 2010

(65) Prior Publication Data

US 2012/0049154 A1  Mar. 1, 2012

(51) Int. Cl.
*H01L 33/38* (2010.01)

(52) U.S. Cl. ............ 257/99; 257/13; 257/E33.062; 257/E33.066; 257/E33.065

(58) Field of Classification Search ......... 257/98, 257/99, E33.065, E33.074, E33.062, 13, 257/95, E33.066
See application file for complete search history.

(56) References Cited

U.S. PATENT DOCUMENTS

| | | | |
|---|---|---|---|
| 4,864,370 A | | 9/1989 | Gaw et al. |
| 6,512,248 B1* | | 1/2003 | Takeuchi et al. ............. 257/81 |
| 6,522,063 B2 | | 2/2003 | Chen et al. |
| 6,611,004 B2* | | 8/2003 | Morimoto .................. 257/99 |
| 2003/0052328 A1* | | 3/2003 | Uemura .................... 257/103 |
| 2003/0111667 A1* | | 6/2003 | Schubert ................... 257/98 |
| 2005/0082555 A1* | | 4/2005 | Chien et al. ............... 257/94 |
| 2007/0018184 A1* | | 1/2007 | Beeson et al. .............. 257/98 |
| 2007/0115670 A1 | | 5/2007 | Roberts et al. |
| 2008/0096297 A1* | | 4/2008 | Schiaffino et al. ......... 438/22 |
| 2008/0237622 A1* | | 10/2008 | Choi et al. ................. 257/98 |
| 2008/0315220 A1* | | 12/2008 | Lee et al. .................. 257/94 |
| 2009/0039359 A1* | | 2/2009 | Yoon et al. ................ 257/88 |
| 2009/0059573 A1 | | 3/2009 | Bears et al. |
| 2010/0038667 A1 | | 2/2010 | Windisch |
| 2010/0053931 A1 | | 3/2010 | Carroll et al. |
| 2010/0327300 A1* | | 12/2010 | Epler et al. ................ 257/98 |

OTHER PUBLICATIONS

International Search Report and Written Opinion issued Dec. 26, 2011 in International Application No. PCT/US2011/047967, 8 pages.

* cited by examiner

*Primary Examiner* — Calvin Lee
*Assistant Examiner* — Scott Stowe
(74) *Attorney, Agent, or Firm* — Perkins Coie LLP

(57) ABSTRACT

Solid state lighting ("SSL") devices with improved contacts and associated methods of manufacturing are disclosed herein. In one embodiment, an SSL device includes a first semiconductor material, a second semiconductor material spaced apart from the first semiconductor material, and an active region between the first and second semiconductor materials. The SSL device also includes an insulative material on the first semiconductor material, the insulative material including a plurality of openings having a size of about 1 nm to about 20 μm, and a conductive material having discrete portions in the individual openings.

8 Claims, 6 Drawing Sheets

«SOLID STATE LIGHTING DEVICES WITH POINT CONTACTS AND ASSOCIATED METHODS OF MANUFACTURING»

TECHNICAL FIELD

The present disclosure is related to solid state lighting ("SSL") devices with point contacts and associated methods of manufacturing.

BACKGROUND

Mobile phones, personal digital assistants ("PDAs"), digital cameras, MP3 players, and other portable electronic devices utilize SSL devices (e.g., light emitting diodes (LEDs)) for background illumination. SSL devices are also used for signage, indoor lighting, outdoor lighting, and other types of general illumination. FIGS. 1A and 1B are cross-sectional and plan views, respectively, of a conventional SSL device 10. As shown in FIGS. 1A and 1B, the SSL device 10 includes a substrate 12 carrying an LED structure 11 having N-type gallium nitride (GaN) 14, GaN/indium gallium nitride (InGaN) multiple quantum wells ("MQWs") 16, and P-type GaN 18. The SSL device 10 also includes a first terminal 20 in contact with the N-type GaN 14 and a second terminal 22 in contact with the P-type GaN 18. The first terminal 20 includes a plurality of contact fingers 21 (three are shown for illustration purposes) coupled to one another by a cross member 23. The second terminal 22 includes a sheet-like structure.

In operation, a continuous or pulsed electrical voltage is applied between the first and second terminals 20 and 22. In response, an electrical current flows from the first terminal 20, through the N-type GaN 14, the GaN/InGaN MQWs 16, and the P-type GaN 18, to the second terminal 22. The GaN/InGaN MQWs 16 then convert a portion of the electrical energy into light. The generated light is extracted from the N-type GaN 14 of the SSL devices 10 for illumination, signage, and/or other suitable purposes.

The SSL device 10, however, may have low light extraction efficiencies. According to conventional techniques, the first and second terminals 20 and 22 typically include aluminum, copper, or other nontransparent conductive materials. As a result, light generated in areas directly between the first and second contacts 20 and 22 can be difficult to extract. On the other hand, the areas directly between the first and second contacts 20 and 22 produce the highest intensity of light in the SSL device 10. As a result, a large portion of the light generated in the SSL device 10 may not be extracted, which results in low light extraction efficiencies. Accordingly, several improvements in increasing light extraction efficiency in SSL devices may be desirable.

DETAILED DESCRIPTION

Various embodiments of SSL devices with point contacts and associated methods of manufacturing are described below. As used hereinafter, the term "SSL device" generally refers to devices with LEDs, organic light emitting diodes ("OLEDs"), laser diodes ("LDs"), polymer light emitting diodes ("PLEDs"), and/or other suitable sources of radiation other than electrical filaments, a plasma, or a gas. The term "light extraction efficiency" generally refers to a ratio of the light extracted from an SSL device to the total light generated in the SSL device. A person skilled in the relevant art will also understand that the technology may have additional embodiments, and that the technology may be practiced without several of the details of the embodiments described below with reference to FIGS. 2A-5B.

Figure 2A:
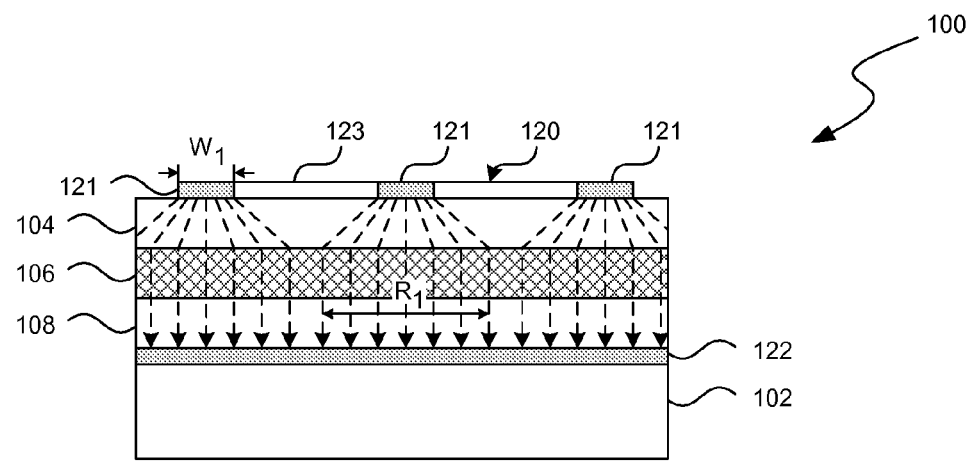
FIGS. 2A-2C are schematic cross-sectional diagrams of a portion of an SSL device illustrating a current spread in the SSL device in accordance with embodiments of the technology.
Figure 2B:
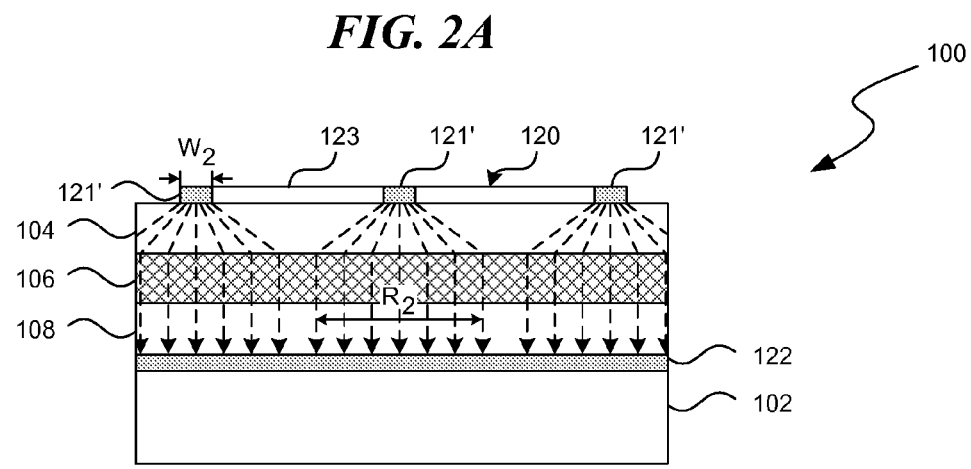
Figure 2C:
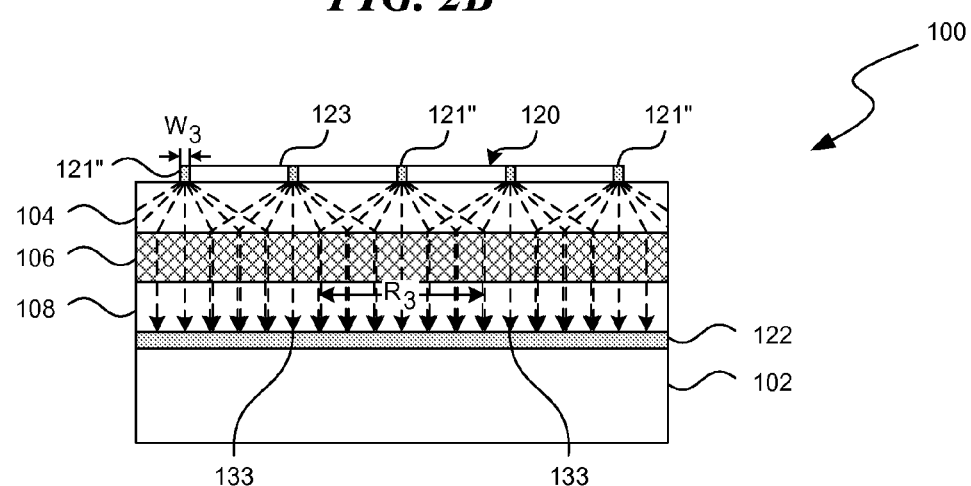

FIGS. 2A-2C are schematic cross-sectional diagrams of a portion of an SSL device 100 illustrating current spread profiles in the SSL device in accordance with embodiments of the technology. As shown in FIGS. 2A-2C, the SSL device 100 can include a substrate material 102, a first terminal 120, a first semiconductor material 104, an active region 106, a second semiconductor material 108, and a second terminal 122 in series. In the illustrated embodiment, the first and second terminals 120 and 122 are arranged vertically relative to each other. In other embodiments, the first and second terminals 120 and 122 can also be arranged laterally relative to each other or can have other suitable contact configurations, as discussed in more detail below with reference to FIGS. 5A and 5B. In any of these embodiments, the SSL device 100 can optionally include a reflective material (e.g., a silver film), a carrier material (e.g., a ceramic substrate), an optical component (e.g., a collimator), and/or other suitable components.

In certain embodiments, the substrate material 102 can include silicon (Si), at least a portion of which has the Si(1, 1, 1) crystal orientation. In other embodiments, the substrate material 102 can include silicon with other crystal orientations (e.g., Si(1,0,0)), AlGaN, GaN, silicon carbide (SiC), sapphire ($Al_2O_3$), zinc oxide ($ZnO_2$), a combination of the foregoing materials, and/or other suitable substrate materials.

The first and second semiconductor materials 104 and 108 can be configured as cladding components for the active region 106. In certain embodiments, the first semiconductor material 104 can include N-type GaN (e.g., doped with silicon (Si)), and the second semiconductor material 108 can include P-type GaN (e.g., doped with magnesium (Mg)). In other embodiments, the first semiconductor material 104 can include P-type GaN, and the second semiconductor material 108 can include N-type GaN. In further embodiments, the first and second semiconductor materials 104 and 108 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 106 can include a single quantum well ("SQW"), MQWs, and/or a bulk semiconductor material. The term "bulk semiconductor material" generally refers to a single grain semiconductor material (e.g., InGaN) with a thickness greater than about 10 nanometers and up to about 500 nanometers. In certain embodiments, the active region 106 can include an InGaN SQW, GaN/InGaN MQWs, and/or an InGaN bulk material. In other embodiments, the active region 106 can include aluminum gallium indium phosphide (AlGaInP), aluminum gallium indium nitride (AlGaInN), and/or other suitable materials or configurations.

In certain embodiments, the first semiconductor material 104, the active region 106, and the second semiconductor material 108 can be formed on the substrate material 102 via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least one of the foregoing components may be formed via other suitable epitaxial growth techniques.

The second terminal 122 can include a sheet-like structure constructed from copper (Cu), aluminum (Al), silver (Ag), gold (Au), platinum (Pt), and/or other suitable metals or metal alloys. Techniques for forming the second terminal 122 can include MOCVD, MBE, spray pyrolysis, pulsed laser deposition, sputtering, electroplating, and/or other suitable deposition techniques.

Figure 1A:
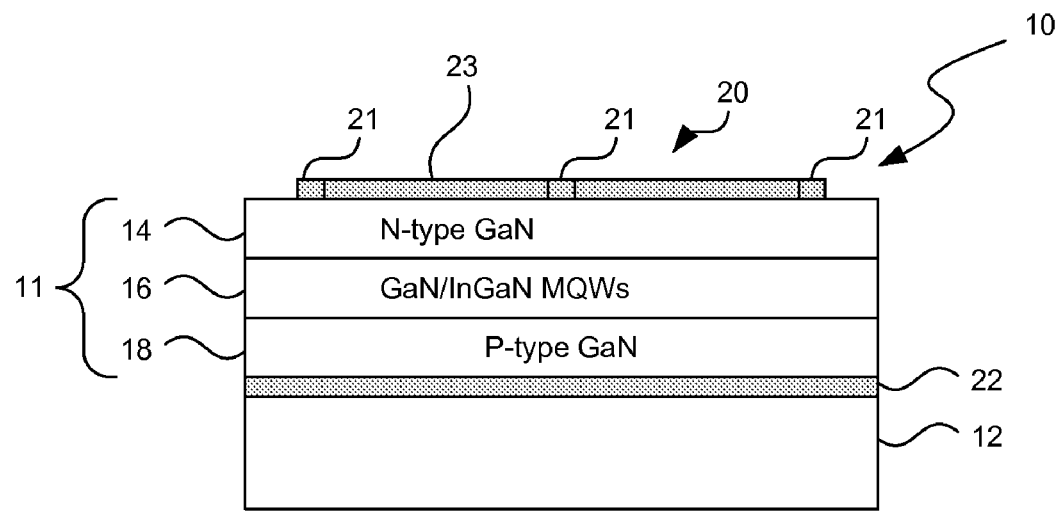
FIG. 1A is a schematic cross-sectional diagram of an SSL device in accordance with the prior art.
Figure 1B:
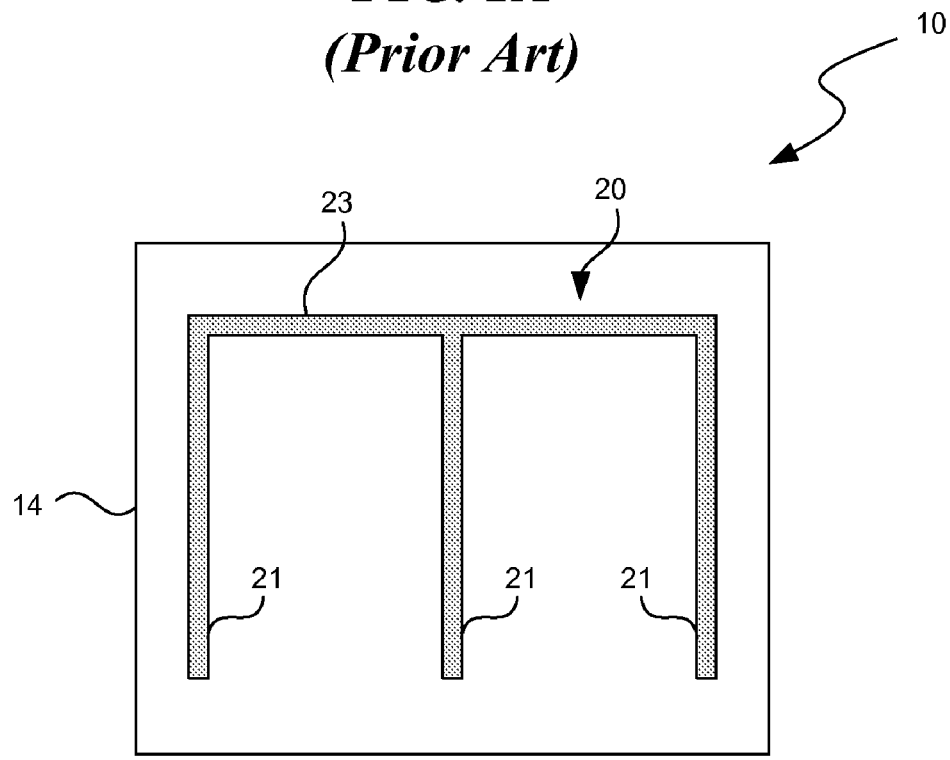
FIG. 1B is a schematic plan view of the SSL device in FIG. 1A.

The first terminal 120 can have a generally similar structure as the first terminal 20 shown in FIG. 1B. For example, the first terminal 120 can include a plurality of contact fingers 121 connected to one another by a cross member 123. The contact fingers 121 and/or the cross member 123 can individually include an elongated structure and/or other suitable structures. The contact fingers 121 and the cross member 123 can be constructed from copper (Cu), aluminum (Al), silver (Ag), gold (Au), platinum (Pt), and/or other suitable metals or metal alloys. In other embodiments, the contact fingers 121 and cross member 123 can be made from a transparent conductive oxide. Though three contact fingers 121 are shown for illustration purposes in FIGS. 2A-2C, in other embodiments, the SSL device 100 can include one, two, four, or any other suitable number of contact fingers.

It has been recognized that light extraction efficiency in the SSL device 100 can be inversely related to an area of the first terminal 120. As shown in FIGS. 2A-2C, the SSL device 100 can have a current spread (identified as $R_1$, $R_2$, and $R_3$ in FIGS. 2A-2C, respectively) in the SSL device 100. As used hereinafter, the term "current spread" generally refers to an effective area in the SSL device 100 through which a current with an effective density flows between individual portions of the first terminal 120 and the second terminal 122. In FIGS. 2A-2C, all the contact fingers 121 have generally the same length for illustration purposes. As a result, the area of the first terminal 120 is represented by respective widths W (identified as $W_1$, $W_2$, and $W_3$ in FIGS. 2A-2C, respectively) of the contact fingers 121 for discussion purposes. One of ordinary skill in the art will appreciate that the following discussion is also applicable to the cross member 123 and/or other components of the first terminal 120.

As shown in FIGS. 2A-2C, the contact fingers 121 have different widths as follows:

$$W_1 > W_2 > W_3$$

In operation, when an electrical voltage is applied between the first and second terminals 120 and 122, an electrical current flows between the first and second terminals 120 and 122. It is believed that a first portion of the current may flow generally vertically following the shortest paths between the first and second terminals 120 and 122. It is also believed that a second portion of the current may flow generally transversely in the first semiconductor material 104 before flowing vertically toward the second terminal 122. As a result, the current density tends to decrease along a direction away from the edges of the first terminal 120. Thus, the current spread can be generally greater than an area of the first terminal 120.

As discussed above, light generated beneath the first terminal 120 can be difficult to extract. As a result, it is desirable that a ratio of the current spread to the width of the contact fingers 121 is large. As shown in FIG. 2B, when the contact fingers 121 are narrow (e.g., to less than about 0.5 mm), the ratio of current spread $R_2$ to width of the contact fingers $W_2$ tends to increase from that of the current spread $R_1$ to width of the contact fingers $W_1$ in FIG. 2A. As a result, a ratio of the area of the contact fingers 121 to the current spread increases as the area decreases as follows:

$$\frac{R_1}{W_1} < \frac{R_2}{W_2} < \frac{R_3}{W_3}$$

Thus, more light may be generated in regions from which light may be easily extracted to improve light extraction efficiency. Accordingly, it is advantageous to have a large number of small contacts than a small number of large contacts.

Having a large number of small contacts can also improve the current density profile in the SSL device 100. As shown in FIG. 2C, when the contact fingers 121" are narrowed below a threshold value (e.g., 0.1 mm), the adjacent current spreads R3 can overlap to form overlapped areas 133. The overlapped areas 133 associated with contact fingers 121" can thus have a higher current density than in conventional devices to yield a more uniform current density profile in the SSL device 100.

As discussed above, light generated in areas underneath the contact fingers 121 may be difficult to extract, and as the area of the contact fingers 121 decreases, more light may be generated from areas offset from the contact fingers 121 where it can be readily extracted from the SSL device 100. As a result, it may be advantageous to select (e.g., reduce) the area of the contact fingers 121 (e.g., the width W) based on a target light extraction efficiency. However, the contact fingers 121 and the cross member 123 with small areas may have high electrical impedance and thus degrade the electrical performance of the SSL device 100. As a result, the areas of the first terminal 120 may not be reduced excessively. Rather, selecting the areas of the first terminal 120 is a balance between the degree of current spread and the electrical performance (e.g., impedance) of the first terminal 120.

Figure 3A:
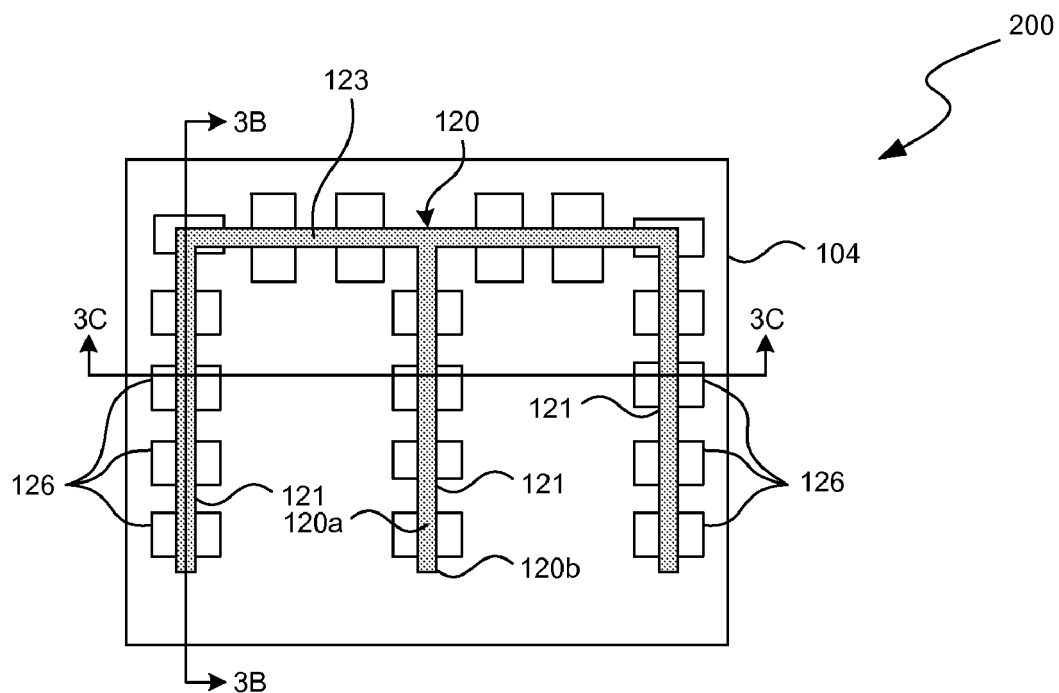
FIG. 3A is a plan view of an SSL device with point contacts in accordance with embodiments of the technology.
Figure 3B:
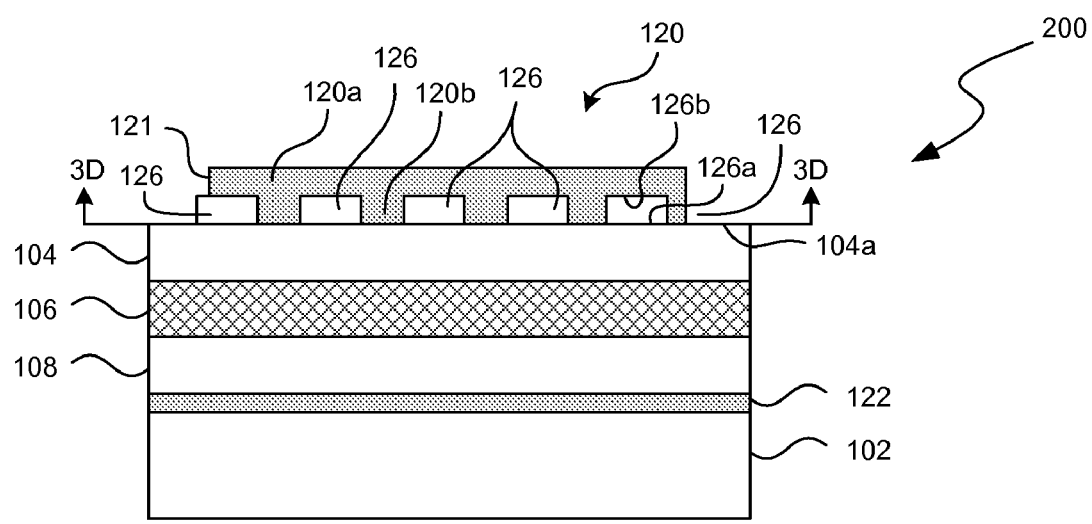
FIGS. 3B and 3C are cross-sectional views of a portion of the SSL device in FIG. 3A.
Figure 3C:
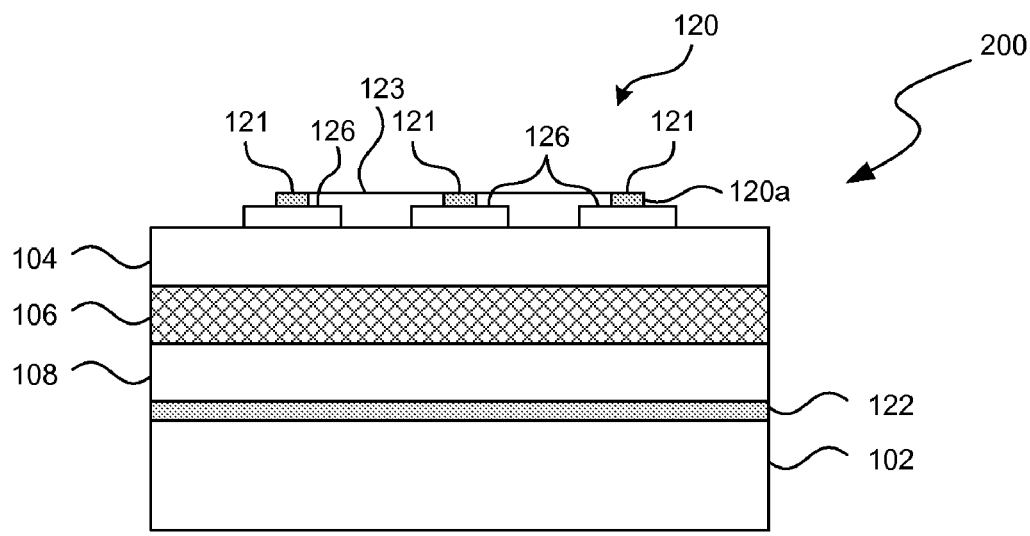
Figure 3D:
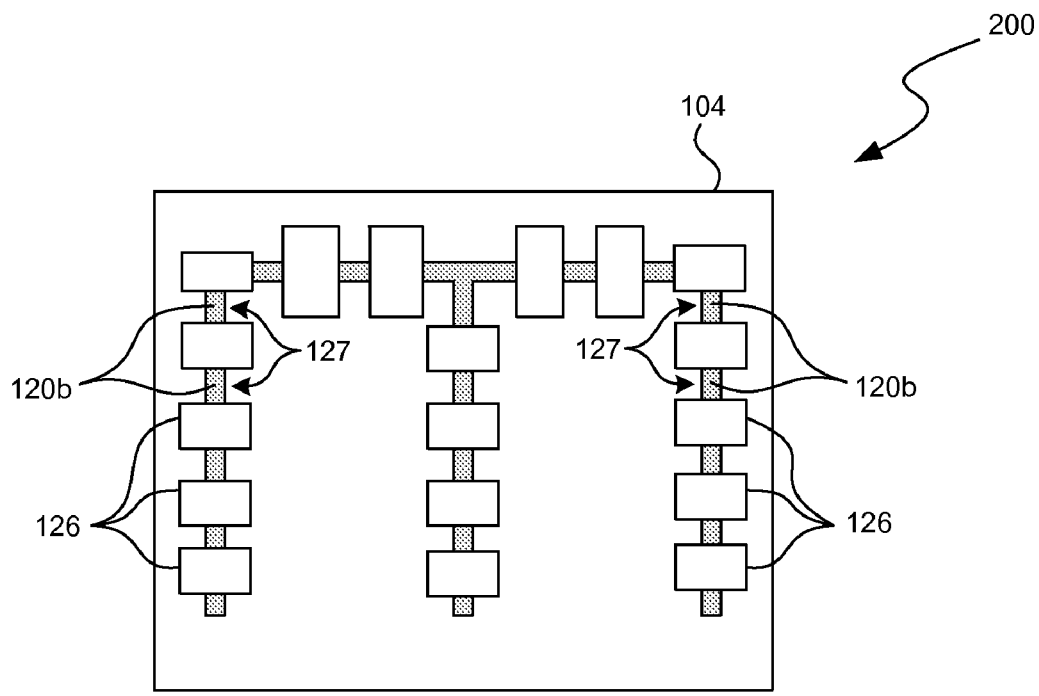
FIG. 3D is a bottom view of a portion of the SSL device in FIG. 3B.

Several embodiments of the current technology can allow a high current spread to area ratio $$\frac{R}{A}$$

while maintaining a sufficient contact area for the second terminal 122 by forming a plurality of point contacts. FIG. 3A is a plan view of an SSL device 200 with point contacts in accordance with embodiments of the technology. FIGS. 3B and 3C are cross-sectional views of orthogonal portions of the SSL device 200 in FIG. 3A. FIG. 3D is a bottom view of a portion of the SSL device 200 in FIG. 3B.

As shown in FIGS. 3A and 3B, the SSL device 200 can include a plurality of insulative pads 126 on the first semiconductor material 104. The contact fingers 121 and cross member 123 of the first terminal 120 cover at least a portion of the pads 126. The pads 126 may be constructed from silicon dioxide (SiO2), silicon nitride (SiN), and/or other dielectric materials via chemical vapor deposition ("CVD"), atomic layer deposition ("ALD"), spin coating, and/or other suitable deposition techniques.

In FIG. 3A, the pads 126 are illustrated as all having a generally similar size and a rectilinear shape. In other embodiments, the pads 126 can also have circular, oval, trapezoidal, and/or other suitable shapes. In further embodiments, at least one of the pads 126 can have different shape, size, or other characteristics than the other pads 126. Even though sixteen pads 126 are illustrated in FIG. 3A, in other embodiments, the SSL device 200 may include any suitable number of pads.

As shown in FIG. 3B, the pads 126 can individually include a first surface 126a in contact with a surface 104a of the first semiconductor material 104 and a second surface 126b opposite the first surface 126a. The first terminal 120 can individually include a first portion 120a on the second surfaces 126b of the pads 126 and a second portion 120b between adjacent pads 126. The second portion 120b includes a plurality of sections in contact with a portion of the surface 104a of the first semiconductor material 104. As a result, the second portion 120b forms an electrical connection with the first semiconductor material 104 while the first portion 120a forms an interconnect that electrically couples all sections of the second portion 120b. Though the first and second portions 120a and 120b are shown as having the same material of construction and are generally homogeneous, in other embodiments, the first and second portions 120a and 120b may include different materials.

As shown in FIG. 3C, the individual pads 126 separate the first portion 120a of the individual contact fingers 121 from the first semiconductor material 104. As a result, the first portion 120a of the individual contact fingers 121 is insulated from the first semiconductor material 104. In the illustrated embodiment, the individual contact fingers 121 have a smaller width than the corresponding pads 126. In other embodiments, the individual contact fingers 121 can have generally the same width than the corresponding pads 126.

FIG. 3D shows a plan view of the SSL device 200 at an interface between the pads 126 and the first semiconductor material 104. As shown in FIG. 3D, the second portion 120b of the first terminal 120 can have a generally rectangular cross section and is arranged in an array. Sections of the second portion 120b can individually form a plurality of point contacts 127 as pillars, bumps, and/or other suitable structures on the first semiconductor material 104. Adjacent point contacts 127 are separated from one another by one of the corresponding pads 126.

Several embodiments of the SSL device 200 can have high current spreads while maintaining an adequate total electrical contact area. In certain embodiments, the individual point contacts 127 can be sufficiently small (e.g., with a width less than about 0.1 mm) to induce large current spreads in the SSL device 200. At the same time, the total area of the point contacts 127 may be maintained because the SSL device 200 may include a sufficient number of point contacts 127 based on a target contact area.

Figure 4A:
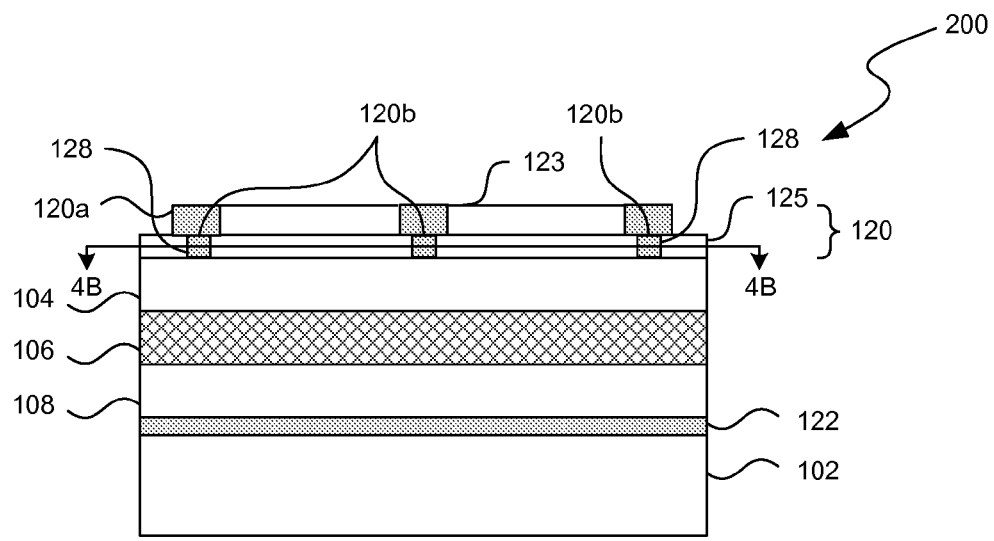
FIG. 4A is a cross-sectional view of another SSL device with point contacts in accordance with embodiments of the technology.
Figure 4B:
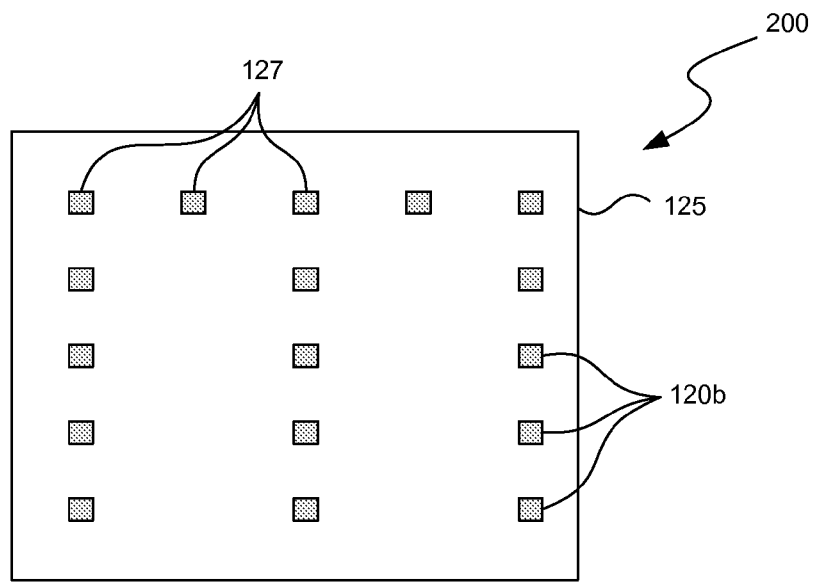
FIG. 4B is a plan view of a portion of the SSL device in FIG. 4A.

Even though the pads 126 are discussed above with reference to FIGS. 3A-3D as discrete structures, in other embodiments, the pads 126 can be interconnected and generally conformal to the first semiconductor material 104. FIG. 4A is a cross-sectional view of an SSL device 200 in accordance with additional embodiments of the technology. FIG. 4B is a plan view of a portion of the SSL device 200 in FIG. 4A. As shown in FIGS. 4A and 4B, the SSL device 200 includes an insulative material 125 generally blanketing the first semiconductor material 104. The insulative material 125 can include a plurality of vias 128 individually containing the second portion 120b of the first terminal 120. Referring to FIG. 4B, the individual sections of the second portion 120b in the vias 128 accordingly define an array of discrete point contacts 127. The insulative material 125 may be constructed from silicon dioxide (SiO2), silicon nitride (SiN), and/or other dielectric materials via chemical vapor deposition ("CVD"), atomic layer deposition ("ALD"), spin coating, and/or other suitable deposition techniques.

Figure 5A:
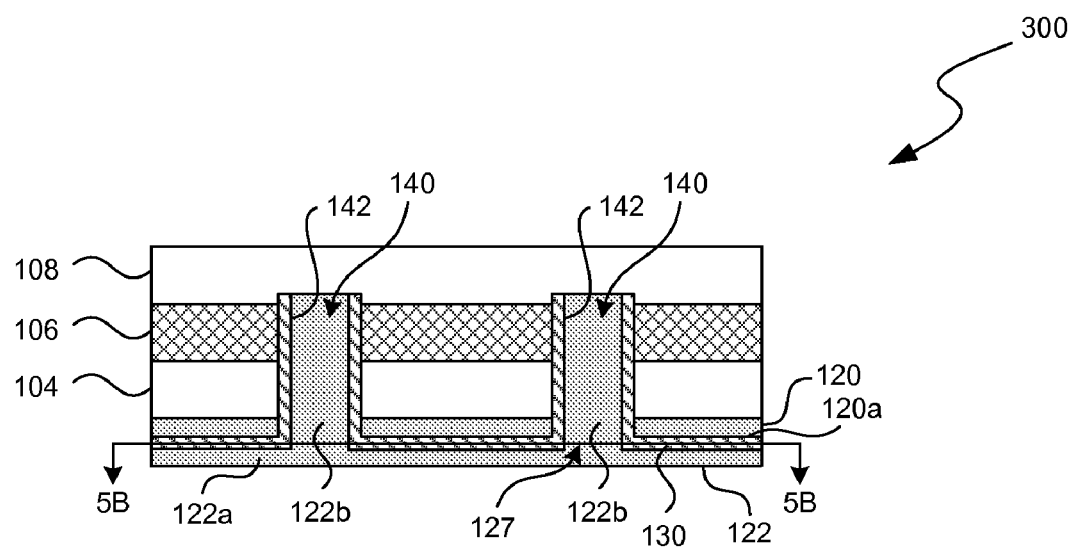
FIG. 5A is a cross-sectional view of another SSL device with point contacts in accordance with embodiments of the technology.
Figure 5B:
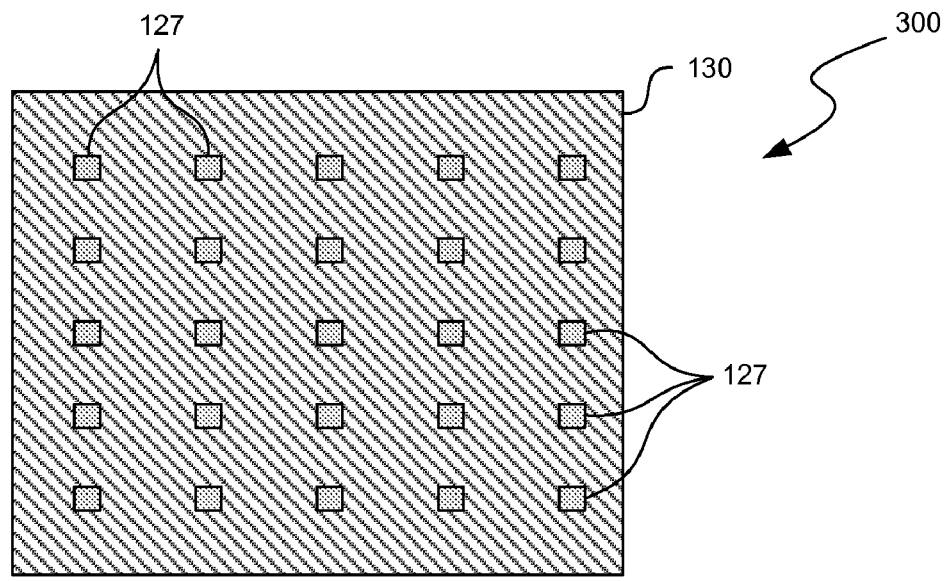
FIG. 5B is a plan view of a portion of the SSL device in FIG. 5A.

FIG. 5A is a cross-sectional view of an SSL device 300 with point contacts in accordance with additional embodiments of the technology. FIG. 5B is a plan view of a portion of the SSL device 300 in FIG. 5A. As shown in FIG. 5A, the SSL device 300 can include a plurality of openings 140 extending from a surface 120a of the first terminal 120 to the second semiconductor material 108. The SSL device 300 also includes an isolation material 130 on the surface 120a of the first terminal 120 and side walls 142 of the openings 140.

The second terminal 122 includes a first portion 122a on the isolation material 130 and a second portion 122b in the openings 140. Parts of the second portion 122b in the individual openings 140 form the point contacts 127. As a result, the second portion 122b is in electrical connection with the first semiconductor material 104 while the first portion 122a interconnects the second portion 122b.

In certain embodiments, the individual point contacts 127 can have a size generally similar to a thickness of the first semiconductor material 104 or the second semiconductor material 108. For example, in one embodiment, the individual point contacts 127 can have a size (e.g., a width, a length, a diameter, or a diagonal length) of about 2 μm to about 4 μm. In other embodiments, the individual point contacts 127 can have a size of about 1 nm to about 20 μm. In further embodiments, the individual point contacts 127 can have other suitable sizes.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

I claim:
1. A solid state lighting (SSL) device, comprising:
an SSL structure having a first surface and a second surface opposite the first surface;
a first electrical terminal on the first surface, the first electrical terminal including
a plurality of discrete point contacts spaced apart from one another and contacting the SSL structure, the individual point contacts having a size of about 1 nm to about 20 μm, and
an interconnect electrically connecting at least a portion of the plurality of discrete point contacts;
an insulative material on the first surface, portions of the insulative material separating adjacent point contacts;
a second electrical terminal on the second surface of the SSL structure;

the insulative material includes a plurality of insulative pads separated from one another by individual point contacts; and
the interconnect includes an elongated structure that electrically connects at least a portion of the plurality of point contacts.

2. A solid state lighting (SSL) device, comprising:
a first semiconductor material having a first surface;
a second semiconductor material spaced apart from the first semiconductor material, the second semiconductor material having a second surface;
an active region between the first and second semiconductor materials, wherein the first and second surfaces are spaced apart from the active region;
a first electrical terminal on the first surface and contacting the first semiconductor material, the first electrical terminal including:
  a plurality of discrete point contacts spaced apart from one another, the individual point contacts having a size of about 1 nm to about 20 µm; and
  an interconnect electrically connecting the plurality of discrete point contacts; and
a second electrical terminal on the second semiconductor material, the second electrical terminal being separated from the first electrical terminal by the second semiconductor material, the active region, and the first semiconductor material;
a plurality of insulative pads on the first semiconductor material;
the point contacts individually include a bump extending from the first semiconductor material; and
adjacent pairs of the bumps are separated from one another by one of the corresponding insulative pads.

3. The SSL device of claim 2 wherein:
the first semiconductor material includes a P-type gallium nitride (GaN) material;
the second semiconductor material includes an N-type GaN material;
the active region includes at least one of a bulk indium gallium nitride (InGaN) material, an InGaN single quantum well ("SQW"), and GaN/InGaN multiple quantum wells ("MQWs"); and
the interconnect includes an elongated structure that electrically connects at least some of the plurality of point contacts.

4. The SSL device of claim 2 wherein:
the bumps extend from the first semiconductor material toward the interconnect.

5. The SSL device of claim 2 wherein:
the interconnect includes an elongated structure that electrically connects at least some of the plurality of bumps.

6. A solid state lighting (SSL) device, comprising:
a first semiconductor material having a first surface;
a second semiconductor material spaced apart from the first semiconductor material, the second semiconductor material having a second surface;
an active region between the first and second semiconductor materials, wherein the first and second surfaces are spaced apart from the active region;
an insulative material on the first semiconductor material, the insulative material including a plurality of openings having a size of about 1 nm to about 20 µm, wherein the openings individually expose a portion of the first semiconductor material;
a conductive material having discrete portions in the individual openings, wherein the discrete portions of the conductive material contact the first semiconductor material at the first surface to form at least a portion of a first electrical terminal; and
a second electrical terminal on the second semiconductor material, the second electrical terminal being separated from the first electrical terminal by the second semiconductor material, the active region, and the first semiconductor material;
wherein the insulative material includes a plurality of pads separated from one another by one of the corresponding openings.

7. A device, comprising:
a solid state lighting (SSL) structure including an active region between a first semiconductor material and a second semiconductor material, the SSL structure having a first surface at the first semiconductor material and a second surface at the second semiconductor material, the first surface being opposite the second surface;
a first electrical terminal on the first surface of the SSL structure, the first electrical terminal including:
  a plurality of discrete point contacts spaced apart from one another and directly contacting the first semiconductor material, the individual point contacts having a size of about 1 nm to about 20 µm; and
  an interconnect electrically connecting the plurality of discrete point contacts; and
a second electrical terminal on the second semiconductor material, the second electrical terminal being separated from the first electrical terminal by the second semiconductor material, the active region, and the first semiconductor material;
the device further includes a plurality of insulative pads on the first semiconductor material;
the point contacts individually include a bump extending from the first semiconductor material; and
adjacent pairs of the bumps are separated from one another by one of the corresponding insulative pads.

8. The device of claim 7 wherein:
the first semiconductor material includes a P-type gallium nitride (GaN) material;
the second semiconductor material includes an N-type GaN material;
the interconnect includes an elongated structure that electrically connects at least some of the plurality of point contacts.

* * * * *